US012043896B2

United States Patent
Savandaiah et al.

(10) Patent No.: US 12,043,896 B2
(45) Date of Patent: Jul. 23, 2024

(54) SYMMETRIC PUMP DOWN MINI-VOLUME WITH LAMINAR FLOW CAVITY GAS INJECTION FOR HIGH AND LOW PRESSURE

(71) Applicant: Applied Materials, Inc., Santa Clara, CA (US)

(72) Inventors: Kirankumar Neelasandra Savandaiah, Bangalore (IN); Srinivasa Rao Yedla, Bangalore (IN); Nitin Bharadwaj Satyavolu, Kakinada (IN); Ganesh Subbuswamy, Bangalore (IN); Devi Raghavee Veerappan, Bangalore (IN); Thomas Brezoczky, Los Gatos, CA (US)

( * ) Notice: Subject to any disclaimer, the term of this patent is extended or adjusted under 35 U.S.C. 154(b) by 0 days.

(21) Appl. No.: 18/333,361

(22) Filed: Jun. 12, 2023

(65) Prior Publication Data
US 2023/0323536 A1  Oct. 12, 2023

Related U.S. Application Data

(62) Division of application No. 17/166,762, filed on Feb. 3, 2021, now Pat. No. 11,674,227.

(51) Int. Cl.
*C23C 16/40* (2006.01)
*C23C 14/22* (2006.01)
(Continued)

(52) U.S. Cl.
CPC ...... *C23C 16/45574* (2013.01); *C23C 14/228* (2013.01); *C23C 14/34* (2013.01); *C23C 16/45544* (2013.01)

(58) Field of Classification Search
CPC . C23C 16/45574; C23C 14/228; C23C 14/34; C23C 16/45544; C23C 16/45504; C23C 16/4585
(Continued)

(56) References Cited

U.S. PATENT DOCUMENTS 5,792,272 A * 8/1998 van Os ............... H01J 37/3244
                                                       118/723 R
5,863,170 A    1/1999 Boitnott et al.
(Continued)

FOREIGN PATENT DOCUMENTS

CN    100411095 C   8/2008
CN    102965643 B   2/2016
(Continued)

*Primary Examiner* — Rudy Zervigon
(74) *Attorney, Agent, or Firm* — Patterson + Sheridan, LLP

(57) ABSTRACT

Aspects of the present disclosure provide systems and apparatuses for a substrate processing assembly with a laminar flow cavity gas injection for high and low pressure. A dual gas reservoir assembly is provided in a substrate processing chamber, positioned within a lower shield assembly. A first gas reservoir is in fluid communication with a processing volume of the substrate processing assembly via a plurality of gas inlet, positioned circumferentially about the processing volume. A second gas reservoir is positioned circumferentially about the first gas reservoir, coupled therewith via one or more reservoir ports. The second gas reservoir is in fluid communication with a first gas source. A recursive path gas assembly is positioned in an upper shield body adjacent to an electrode to provide one or more gases to a dark space gap.

20 Claims, 7 Drawing Sheets

(51) Int. Cl.
*C23C 14/34* (2006.01)
*C23C 16/455* (2006.01)

(58) Field of Classification Search
USPC ..... 118/723 E, 723 ER; 156/345.43, 345.44, 156/345.45, 345.46, 345.47
See application file for complete search history.

(56) References Cited

U.S. PATENT DOCUMENTS

| | | | |
|---|---|---|---|
| 5,879,459 A | 3/1999 | Gadgil et al. | |
| 6,162,299 A | 12/2000 | Raaijmakers | |
| 6,440,261 B1 | 8/2002 | Tepman et al. | |
| 6,447,607 B2 | 9/2002 | Soininen et al. | |
| 6,576,062 B2 | 6/2003 | Matsuse | |
| 6,604,853 B2 | 8/2003 | Chao et al. | |
| 6,635,115 B1 | 10/2003 | Fairbairn et al. | |
| 6,852,194 B2 | 2/2005 | Matsushita et al. | |
| 6,962,471 B2 | 11/2005 | Birkner et al. | |
| 7,066,703 B2 | 6/2006 | Johnson | |
| 7,090,741 B2 | 8/2006 | Narushima et al. | |
| D527,751 S | 9/2006 | Kondoh et al. | |
| 7,138,336 B2 | 11/2006 | Lee et al. | |
| 7,169,234 B2 | 1/2007 | Weeks et al. | |
| 7,189,432 B2 | 3/2007 | Chiang et al. | |
| 7,258,768 B2 | 8/2007 | Yamazaki | |
| 7,318,869 B2 | 1/2008 | Chiang et al. | |
| 7,422,406 B2 | 9/2008 | van der Meulen | |
| 7,458,763 B2 | 12/2008 | van der Meulen | |
| 7,537,662 B2 | 5/2009 | Soininen et al. | |
| 7,784,164 B2 | 8/2010 | White et al. | |
| 7,799,179 B2 | 9/2010 | Maass et al. | |
| 7,806,983 B2 | 10/2010 | Chiang et al. | |
| 7,833,352 B2 | 11/2010 | Bondestam et al. | |
| 7,905,991 B2 | 3/2011 | Esselbach et al. | |
| 7,959,403 B2 | 6/2011 | van der Meulen | |
| 7,988,399 B2 | 8/2011 | van der Meulen | |
| 8,029,226 B2 | 10/2011 | van der Meulen | |
| 8,033,772 B2 | 10/2011 | Kurita et al. | |
| 8,088,678 B2 | 1/2012 | Kitano et al. | |
| 8,197,177 B2 | 6/2012 | van der Meulen et al. | |
| 8,216,380 B2 | 7/2012 | White et al. | |
| 8,267,632 B2 | 9/2012 | van der Meulen et al. | |
| 8,292,563 B2 | 10/2012 | Haris | |
| 8,313,277 B2 | 11/2012 | van der Meulen et al. | |
| 8,354,656 B2 | 1/2013 | Beloussov et al. | |
| 8,403,613 B2 | 3/2013 | van der Meulen | |
| 8,434,989 B2 | 5/2013 | van der Meulen | |
| 8,439,623 B2 | 5/2013 | van der Meulen | |
| 8,500,388 B2 | 8/2013 | van der Meulen et al. | |
| 8,523,507 B2 | 9/2013 | van der Meulen | |
| 8,558,299 B2 | 10/2013 | Cao et al. | |
| 8,574,409 B2 | 11/2013 | Kadlec et al. | |
| 8,602,716 B2 | 12/2013 | van der Meulen et al. | |
| 8,672,605 B2 | 3/2014 | van der Meulen et al. | |
| 8,696,298 B2 | 4/2014 | van der Meulen et al. | |
| 8,728,239 B2 | 5/2014 | Bauer et al. | |
| 8,807,905 B2 | 8/2014 | Meulen | |
| 8,812,150 B2 | 8/2014 | van der Meulen et al. | |
| 8,870,513 B2 | 10/2014 | Voser et al. | |
| 8,870,514 B2 | 10/2014 | van der Meulen et al. | |
| 8,895,450 B2 | 11/2014 | Cao et al. | |
| 8,944,738 B2 | 2/2015 | van der Meulen | |
| 8,945,308 B2 | 2/2015 | Schaller | |
| 9,005,539 B2 | 4/2015 | Halpin et al. | |
| 9,085,825 B2 | 7/2015 | Kim | |
| 9,103,030 B2 | 8/2015 | Kato et al. | |
| 9,214,589 B2 | 12/2015 | Voser et al. | |
| 9,252,037 B2 | 2/2016 | Scholte Von Mast et al. | |
| 9,281,222 B2 | 3/2016 | Weaver et al. | |
| 9,336,997 B2 | 5/2016 | Bera | |
| 9,340,874 B2 | 5/2016 | Halpin et al. | |
| 9,347,131 B2 | 5/2016 | Maass et al. | |
| 9,355,824 B2 | 5/2016 | Kadlec et al. | |
| 9,378,994 B2 | 6/2016 | Weaver et al. | |
| 9,396,981 B2 | 7/2016 | Scholte Von Mast et al. | |
| 9,443,749 B2 | 9/2016 | Wakabayashi et al. | |
| 9,478,420 B2 | 10/2016 | Castaldi et al. | |
| 9,490,149 B2 | 11/2016 | Chandrasekharan et al. | |
| 9,551,068 B2 | 1/2017 | Kumagai et al. | |
| 9,583,349 B2 | 2/2017 | Gandikota et al. | |
| 9,587,306 B2 | 3/2017 | Rohrmann et al. | |
| 9,644,261 B2 | 5/2017 | Weichart et al. | |
| 9,698,009 B2 | 7/2017 | Sato et al. | |
| 9,831,094 B2 | 11/2017 | Rahtu et al. | |
| 9,842,755 B2 | 12/2017 | Ocker et al. | |
| 9,884,726 B2 | 2/2018 | van der Meulen et al. | |
| 9,890,473 B2 | 2/2018 | Newman | |
| 9,929,008 B2 | 3/2018 | Wamura et al. | |
| 9,932,674 B2 | 4/2018 | Kato et al. | |
| 9,953,843 B2 | 4/2018 | Shen et al. | |
| 9,960,072 B2 | 5/2018 | Coomer | |
| 10,043,693 B1 | 8/2018 | Kim et al. | |
| 10,086,511 B2 | 10/2018 | van der Meulen | |
| 10,138,553 B2 | 11/2018 | Scholte Von Mast et al. | |
| 10,145,014 B2 | 12/2018 | Nozawa et al. | |
| 10,202,682 B2 | 2/2019 | Rieschl et al. | |
| 10,202,687 B2 | 2/2019 | Miura et al. | |
| 10,221,480 B2 | 3/2019 | Kato et al. | |
| 10,256,125 B2 | 4/2019 | Weaver et al. | |
| 10,262,888 B2 | 4/2019 | Gangakhedkar et al. | |
| 10,347,515 B2 | 7/2019 | Heinz | |
| 10,388,559 B2 | 8/2019 | Rieschl et al. | |
| 10,427,303 B2 | 10/2019 | Weaver et al. | |
| 10,586,720 B2 | 3/2020 | Weaver et al. | |
| 2002/0051698 A1 | 5/2002 | Birkner et al. | |
| 2002/0170671 A1 | 11/2002 | Matsushita et al. | |
| 2003/0109094 A1 | 6/2003 | Seidel et al. | |
| 2004/0099378 A1* | 5/2004 | Kim | C23C 16/4558 156/345.33 |
| 2004/0159553 A1 | 8/2004 | Nogami et al. | |
| 2004/0261710 A1 | 12/2004 | Matsushita et al. | |
| 2005/0005850 A1 | 1/2005 | Yamazaki | |
| 2005/0006230 A1 | 1/2005 | Narushima et al. | |
| 2005/0111936 A1 | 5/2005 | Kim et al. | |
| 2005/0115822 A1 | 6/2005 | Maass et al. | |
| 2005/0118009 A1 | 6/2005 | van der Meulen | |
| 2006/0051507 A1 | 3/2006 | Kurita et al. | |
| 2006/0056952 A1 | 3/2006 | Haris | |
| 2006/0101728 A1 | 5/2006 | White et al. | |
| 2006/0137608 A1 | 6/2006 | Choi et al. | |
| 2006/0137609 A1 | 6/2006 | Puchacz et al. | |
| 2006/0157340 A1 | 7/2006 | Kurita et al. | |
| 2006/0201074 A1 | 9/2006 | Kurita et al. | |
| 2006/0263177 A1 | 11/2006 | Meulen | |
| 2007/0020890 A1 | 1/2007 | Thakur et al. | |
| 2007/0215036 A1 | 9/2007 | Park et al. | |
| 2007/0281090 A1 | 12/2007 | Kurita et al. | |
| 2008/0014055 A1 | 1/2008 | van der Meulen | |
| 2008/0072821 A1 | 3/2008 | Dalton et al. | |
| 2008/0124194 A1 | 5/2008 | van der Meulen et al. | |
| 2008/0124197 A1 | 5/2008 | van der Meulen et al. | |
| 2008/0138176 A1 | 6/2008 | Kim et al. | |
| 2008/0187417 A1 | 8/2008 | van der Meulen et al. | |
| 2008/0219808 A1 | 9/2008 | van der Meulen et al. | |
| 2008/0219812 A1 | 9/2008 | van der Meulen et al. | |
| 2008/0226429 A1 | 9/2008 | van der Meulen | |
| 2008/0232947 A1 | 9/2008 | van der Meulen et al. | |
| 2009/0087286 A1 | 4/2009 | Meulen | |
| 2009/0173622 A1 | 7/2009 | Weichart et al. | |
| 2009/0180847 A1 | 7/2009 | Guo et al. | |
| 2010/0012036 A1 | 1/2010 | Silva et al. | |
| 2010/0075453 A1 | 3/2010 | Kurita et al. | |
| 2010/0120238 A1 | 5/2010 | Kitano et al. | |
| 2010/0236691 A1 | 9/2010 | Yamazaki | |
| 2010/0281683 A1 | 11/2010 | White et al. | |
| 2010/0304027 A1 | 12/2010 | Lee et al. | |
| 2010/0327187 A1 | 12/2010 | Beloussov et al. | |
| 2012/0009765 A1* | 1/2012 | Olgado | C23C 16/45565 257/E21.09 |
| 2012/0027542 A1 | 2/2012 | Isomura et al. | |
| 2012/0031749 A1 | 2/2012 | Dubs et al. | |
| 2012/0328797 A1 | 12/2012 | Maass et al. | |
| 2013/0270107 A1 | 10/2013 | Ewert et al. | |
| 2013/0302115 A1 | 11/2013 | Wakabayashi et al. | |

(56) References Cited

U.S. PATENT DOCUMENTS

| | | |
|---|---|---|
| 2014/0262035 A1 | 9/2014 | Merry et al. |
| 2014/0349011 A1 | 11/2014 | Weichart |
| 2015/0063957 A1 | 3/2015 | Olgado |
| 2015/0240360 A1 | 8/2015 | Leeser |
| 2016/0108515 A1 | 4/2016 | Elghazzali et al. |
| 2016/0138159 A1 | 5/2016 | Kato et al. |
| 2017/0175247 A1 | 6/2017 | Weichart |
| 2017/0218514 A1 | 8/2017 | Kato et al. |
| 2018/0142350 A1 | 5/2018 | Fukiage et al. |
| 2018/0195173 A1 | 7/2018 | Kato et al. |
| 2018/0211820 A1 | 7/2018 | Krishna et al. |
| 2018/0245212 A1 | 8/2018 | Schwyn-Thony et al. |
| 2018/0245218 A1 | 8/2018 | Kato |
| 2018/0261473 A1 | 9/2018 | Weichart et al. |
| 2018/0334745 A1 | 11/2018 | Kato |
| 2019/0013225 A1 | 1/2019 | Taguchi et al. |
| 2019/0096715 A1 | 3/2019 | Lodder et al. |
| 2019/0252160 A1 | 8/2019 | Balon et al. |
| 2019/0252166 A1 | 8/2019 | Felzer et al. |

FOREIGN PATENT DOCUMENTS

| | | | |
|---|---|---|---|
| CN | 105200393 B | 10/2018 | |
| DE | 10350517 A1 | 6/2005 | |
| DE | 102012103295 A1 | 7/2013 | |
| DE | 102013111790 A1 | 4/2015 | |
| DE | 102013113052 A1 | 5/2015 | |
| EP | 2102889 A2 | 9/2009 | |
| JP | 2007107047 A | 4/2007 | |
| JP | 5088284 B2 | 12/2012 | |
| JP | 5315898 B2 | 10/2013 | |
| JP | 5544697 B2 | 7/2014 | |
| JP | 5870568 B2 | 3/2016 | |
| JP | 6330623 B2 | 5/2018 | |
| JP | 6464765 B2 | 2/2019 | |
| JP | 6478847 B2 | 3/2019 | |
| JP | 2019036630 A | 3/2019 | |
| KR | 101887072 B1 | 8/2018 | |
| KR | 20190030415 A | 3/2019 | |
| WO | 0137317 A1 | 5/2001 | |
| WO | WO-2007032858 A1 * | 3/2007 | ......... C23C 14/3407 |
| WO | 2017212077 A2 | 12/2017 | |
| WO | 2018197305 A2 | 11/2018 | |
| WO | 2019020391 A1 | 1/2019 | |
| WO | 2019020393 A1 | 1/2019 | |
| WO | 2019096515 A1 | 5/2019 | |
| WO | 2019096564 A1 | 5/2019 | |
| WO | 2019105671 A1 | 6/2019 | |

* cited by examiner

SYMMETRIC PUMP DOWN MINI-VOLUME WITH LAMINAR FLOW CAVITY GAS INJECTION FOR HIGH AND LOW PRESSURE

CROSS-REFERENCE TO RELATED APPLICATIONS

This application is a Divisional application of U.S. patent application Ser. No. 17/166,762, filed Feb. 3, 2021, and assigned to the assignee hereof, the content of of which is hereby incorporated by reference in its entirety.

BACKGROUND

Field

Embodiments of the present invention generally relate to a substrate processing assembly, and more particularly, to laminar gas flow processing space injection.

Description of the Related Art

When processing substrates in a substrate processing chamber, such as with a reactive physical vapor deposition (PVD) process, an atomic layer deposition (ALD) process, a chemical vapor deposition (CVD) process, an etch process, a thermal process, or a plasma ion implant process, or other processes, once a metal is introduced to the processing space, the rate at which it ionizes and travels to the substrate depends on conditions prevailing in the processing space of the chamber. Maintaining a uniform pressure gradient across the substrate is needed in order to achieve proper ion density and film uniformity. Non-uniformities in the pressure gradient may result in non-uniform ion densities and ion velocities that result in non-uniform film deposition.

In conventional approaches, a gas may be provided from a gas source in a direct manner to the processing space, resulting in a jet effect of gases across the substrate. As a result, pressure across the substrate is non-uniform, causing non-uniform ion densities and skewness in the distribution of gases that in turn result in non-uniform ion densities and film deposition.

What is needed are systems and apparatus to avoid shortcomings of prior approaches.

SUMMARY

In certain embodiments, a substrate processing assembly is disclosed that includes a transfer chamber assembly having one or more walls that define a transfer volume, and a plurality of substrate processing assemblies coupled to the transfer chamber assembly. The substrate processing assemblies include an upper shield body configured to surround a processing volume and a portion of an electrode, a lower shield body that includes a first gas reservoir and a second gas reservoir, one or more reservoir ports that fluidly couple the first gas reservoir to the second gas reservoir, and an array of lower gas inlets that are in fluid communication with the processing volume, and are in fluid communication with the second gas reservoir. The substrate processing assembly further includes an array of upper gas inlets disposed in the upper shield body and positioned to provide one or more gases to a dark space gap that is in fluid communication with the processing volume and is formed between the electrode and the upper shield body when a substrate is being processed in the substrate processing assembly.

In further embodiments, a substrate processing assembly is disclosed that includes a transfer chamber assembly having one or more walls that define a transfer volume and a plurality of substrate processing assemblies coupled to the transfer chamber assembly. The substrate processing assemblies include an upper shield body configured to surround a processing volume and a portion of an electrode, an array of lower gas inlets that are in fluid communication with the processing volume, positioned to provide one or more gases to a lower annular portion of the processing volume adjacent to a cover ring, and an array of upper gas inlets disposed in the upper shield body and positioned to provide one or more gases to a dark space gap that is in fluid communication with the processing volume and is formed between the electrode and the upper shield body when a substrate is being processed in a substrate processing assembly, the upper gas inlets coupled to a second gas source via a recursive gas path.

Further embodiments disclosed include an apparatus configured to simultaneously process a plurality of substrates that includes a transfer chamber assembly having one or more walls that define a transfer volume and a substrate processing assembly disposed in the transfer chamber assembly. The substrate processing assembly includes an upper shield body surrounding a processing volume and a lower shield body surrounding the processing volume. The substrate processing assembly further includes a plurality of lower gas inlets disposed about the lower shield body, positioned to provide one or more gases to a lower annular portion of the processing volume adjacent to a cover ring, the lower gas inlets coupled to a first gas source via dual gas reservoirs, and an array of upper gas inlets disposed in the upper shield body, positioned to provide one or more gases to a dark space gap of the substrate processing assembly, the upper gas inlets coupled to a second gas source via a recursive gas path.

The following description and the related drawings set forth in detail certain illustrative features of one or more embodiments.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
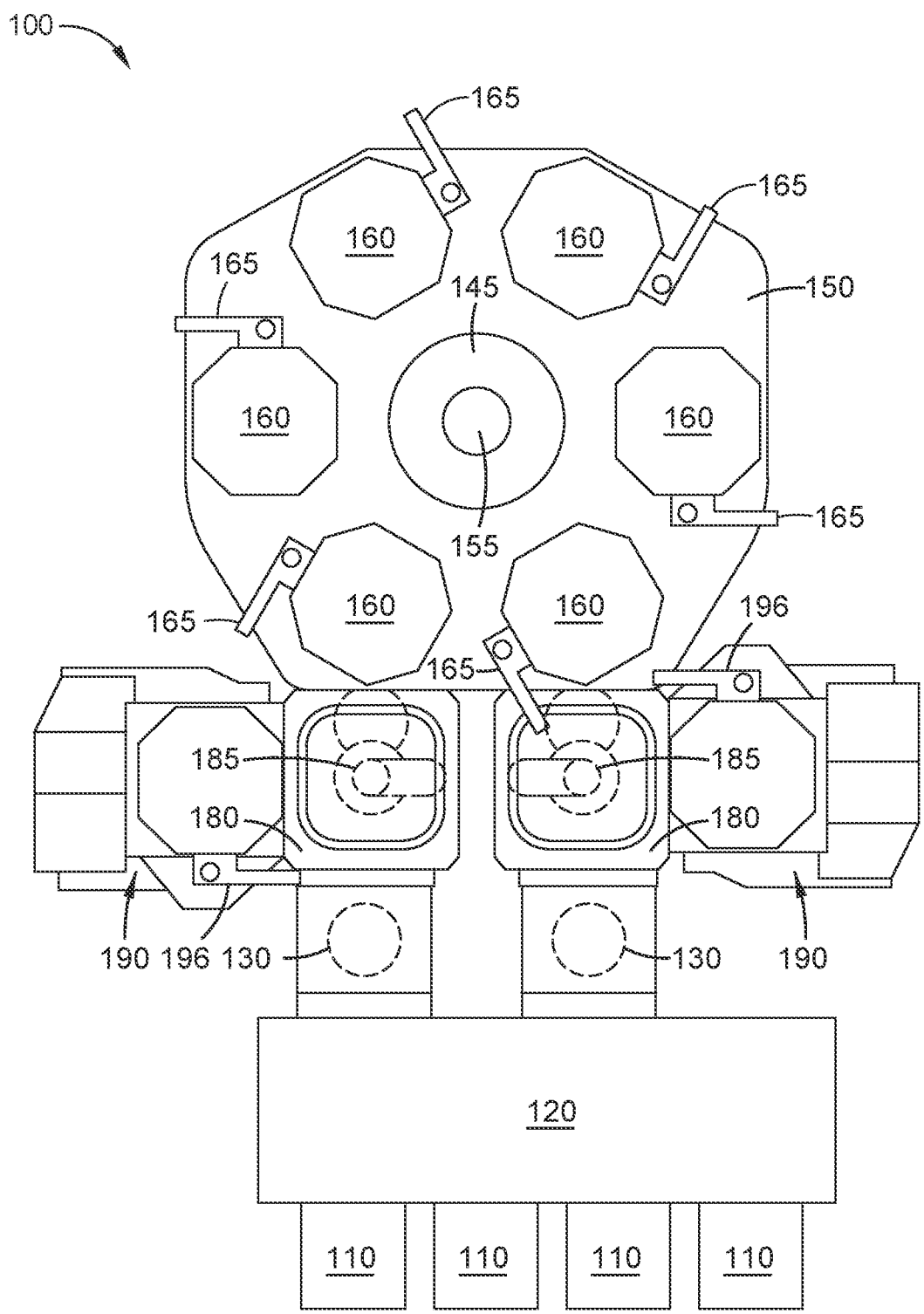
FIG. 1 is a plan view of a cluster tool assembly according to certain embodiments.

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, a reference to "the disclosure" shall not be construed as a generalization of any inventive subject matter disclosed herein and shall not be considered to be an element or limitation of the appended claims except where explicitly recited in a claim(s).

Aspects of the present disclosure provide systems and apparatuses for a substrate processing assembly with a laminar flow cavity gas injection for high and low pressure. A dual gas reservoir assembly is provided in a substrate processing chamber, positioned within a lower shield assembly. A first gas reservoir is in fluid communication with a processing volume of the substrate processing assembly via a plurality of gas inlets, positioned circumferentially about the processing volume. A second gas reservoir is positioned circumferentially about the first gas reservoir, coupled therewith via one or more reservoir ports. The second gas reservoir is in fluid communication with a first gas source. A recursive path gas assembly is positioned in an upper shield body adjacent to an electrode to provide one or more gases to a dark space gap.

Embodiments of the present disclosure are directed towards apparatus for substrate processing and a cluster tool including a transfer chamber assembly and a plurality of processing assemblies. The transfer chamber assembly and processing assemblies may include processing platforms for ALD, CVD, PVD, etch, cleaning, implanting, heating, annealing, and/or polishing processes. Other processing platforms may also be used with the present disclosure. The present disclosure generally provides a substrate processing tool with increased process condition flexibility between process assemblies within the same cluster tool.

The present disclosure includes embodiments for substrate processing. A substrate and optionally a support chuck may be transported between processing assemblies within a transfer volume formed by a transfer chamber assembly. The processing assemblies include processing volumes in which the substrate is processed. The support chuck may optionally detach from a lift assembly while being transported between processing assemblies. When the substrate and the support chuck are disposed on the lift assembly, the lift assembly raises the substrate and support chuck to an upper processing position. While in the upper processing position, surfaces of the processing assembly and the support chuck seal against one another to form a fluidly isolated processing volume. The processing volume is fluidly isolated from the transfer volume formed by the transfer chamber assembly.

The isolation of the processing volume from the transfer volume by the movement of the lift assembly allows for each of the processing volumes to be adjusted to different pressures. This enables different substrate processing steps to be performed within each of the processing assemblies within the transfer chamber assembly even when each processing step requires different pressures and temperatures. The use of the support chuck as the sealing member within the processing assembly also minimizes the volume of the processing volume. Minimizing the processing volume decreases the amount of process gases and purge gases required during each process. The sealing between each processing volume and the transfer volume additionally minimizes process gas leakage into the transfer chamber. The apparatus and method utilized to create the seal between the processing volumes and the transfer volume minimize particle contamination within the processing volumes and decrease downtime of the apparatus caused by part replacement and cleaning.

Figure 2:
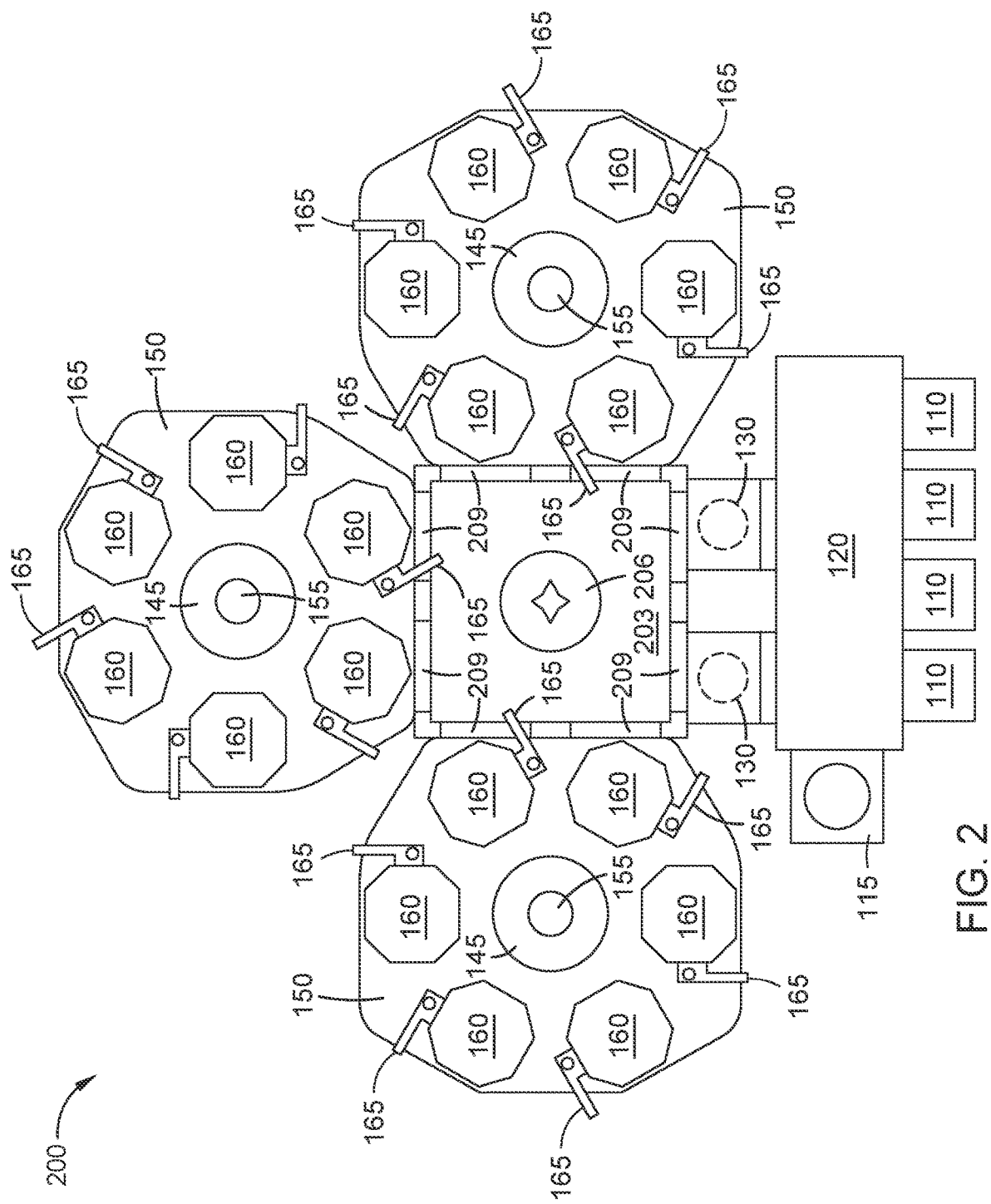
FIG. 2 is a plan view of a cluster tool assembly having a plurality of transfer chamber assemblies, according to certain embodiments.

FIGS. 1 and 2 are plan views of cluster tool assemblies 100, 200 with transfer chamber assemblies 150 and substrate processing assemblies 160 as described herein. The cluster tool assembly 100 of FIG. 1 includes a single transfer chamber assembly 150 and a plurality of front end robot chambers 180 between the transfer chamber assembly 150 and load lock chambers 130. The cluster tool assembly 200 of FIG. 2 includes multiple transfer chamber assemblies 150 and a buffer chamber 203 disposed between the transfer chamber assemblies 150 and load lock chambers 130.

In FIG. 1, the cluster tool assembly 100 includes Front Opening Unified Pods (FOUPs) 110, a Factory Interface (FI) 120 adjacent to and operably connected to the FOUPs 110, load lock chambers 130 adjacent to and operably connected to the FI 120, front end robot chambers 180 adjacent to and operatively connected to the load lock chambers 130, prep chambers 190 adjacent to and operatively connected to the front end robot chambers 180, and a transfer chamber assembly 150 connected to the front end robot chambers 180.

The FOUPs 110 are utilized to safely secure and store substrates during movement thereof between different substrate processing equipment, as well as during the connection of the FOUPs to the substrate processing equipment while the substrates are disposed therein. The number of FOUPs 110 (four shown) may vary in quantity depending upon the processes run in the cluster tool assembly 100. The throughput of the cluster tool assembly 100 also, at least in part, defines the number of docking stations on the FI 120 to which the FOUPs are connected for the unloading of substrates therefrom and the loading of substrates thereinto. The FI 120 is disposed between the FOUPs 110 and the load lock chambers 130. The FI 120 creates an interface between a semiconductor fabrication facility (Fab) and the cluster tool assembly 100. The FI 120 is connected to the load lock chambers 130, such that substrates are transferred from the FI 120 to the load lock chambers 130 and from the load lock chambers 130 and into the FI 120.

The front end robot chambers 180 are located on the same side of each of the load lock chambers 130, such that the load lock chambers 130 are located between the FI 120 and the front end robot chambers 180. The front end robot chambers 180 each include a transfer robot 185 therein. The transfer robot 185 is any robot suitable to transfer one or more substrates from one chamber to another, through or via the front end robot chamber 180. In some embodiments, as shown in FIG. 1, the transfer robot 185 within each front end robot chamber 180 is configured to transport substrates from one of the load lock chambers 130 and into one of the prep chambers 190.

The prep chambers 190 may be any one of a pre-clean chamber, an anneal chamber, or a cool down chamber, depending upon the desired process within the cluster tool assembly 100. In some embodiments, the prep chambers 190 are plasma clean chambers. In yet other exemplary embodiments, the prep chambers 192 are Preclean II chambers available from Applied Materials, Inc., of Santa Clara, Calif. A vacuum pump 196 is positioned adjacent to each of the prep chambers 192. The vacuum pumps 196 are configured to pump the prep chambers 190 to a predetermined pressure. In some embodiments, the vacuum pump 196 is configured to decrease the pressure of the prep chamber 192, such as to create a vacuum within the prep chamber 192.

As shown in FIG. 1, two load lock chambers 130, two front end robot chambers 180, and two prep chambers 190 are configured within the cluster tool assembly 100. The two load lock chambers 130, the two front end robot chambers 180, and the two prep chambers 190, when arranged as shown in FIG. 1 and described above, may form two transport assemblies. The two transport assemblies may be spaced from each other and may form mirror images of one another, such that the prep chambers 190 are on opposite walls of their respective front end robot chambers 180.

The transfer chamber assembly 150 is adjacent to, and operatively connected to, the front end robot chambers 180, such that substrates are transferred between the transfer chamber assembly 150 and front end robot chambers 180. The transfer chamber assembly 150 includes a central transfer device 145 and a plurality of substrate processing assemblies 160 therein. The plurality of substrate processing assemblies 160 are disposed around the central transfer device 145, radially outward of a pivot or central axis of the central transfer device 145 in the transfer chamber assembly 150.

A chamber pump 165 is disposed adjacent to, and in fluid communication with, each of the substrate processing assemblies 160, such that there are a plurality of chamber pumps 165 disposed around the central transfer device 145. The plurality of chamber pumps 165 are disposed radially outward of the central transfer device 145 in the transfer chamber assembly 150. As shown in FIG. 1, one chamber pump 165 is fluidly coupled to each of the substrate processing assemblies 160.

In some embodiments, there may be multiple chamber pumps 165 fluidly coupled to each substrate processing assembly 160. In yet other embodiments, one or more of the substrate processing assemblies 160 may not have a chamber pump 165 directly fluidly coupled thereto. In some embodiments a varying number of chamber pumps 165 are fluidly coupled to each substrate processing assembly 160, such that one or more substrate processing assemblies 160 may have a different number of chamber pumps 165 than one or more other substrate processing assemblies 160. The chamber pumps 165 enable separate vacuum pumping of processing regions within each substrate processing assembly 160, and thus the pressure within each of the processing assemblies may be maintained separately from one another and separately from the pressure present in the transfer chamber assembly 150.

FIG. 1 depicts an embodiment having six substrate processing assemblies 160 within the transfer chamber assembly 150. However, other embodiments may have a different number of substrate processing assemblies 160 within the transfer chamber assembly 150. For example, in some embodiments, two to twelve substrate processing assemblies 160 may be positioned within the transfer chamber assembly 150, such as four to eight substrate processing assemblies 160. In other embodiments, four substrate processing assemblies 160 may be positioned within the transfer chamber assembly 150. The number of substrate processing assemblies 160 impact the total footprint of the cluster tool assembly 100, the number of possible process steps capable of being performed by the cluster tool assembly 100, the total fabrication cost of the cluster tool assembly 100, and the throughput of the cluster tool assembly 100.

Each of the substrate processing assemblies 160 can be any one of PVD, CVD, ALD, etch, cleaning, heating, annealing, and/or polishing platforms. In some embodiments, the substrate processing assemblies 160 are all one type of processing platform. In other embodiments, the substrate processing assemblies 160 includes two or more different processing platforms. In one exemplary embodiment, all of the substrate processing assemblies 160 are PVD process chambers. In another exemplary embodiment, the substrate processing assemblies 160 includes both PVD and CVD process chambers. The plurality of substrate processing assemblies 160 can be altered to match the types of process chambers needed to complete a semiconductor fabrication process.

The central transfer device 145 is disposed at generally the center of the transfer chamber assembly 150, such that a central axis 155 of the transfer chamber assembly 150 is disposed through the central transfer device 145. The central transfer device 145, is any suitable transfer device configured to transport substrates between each of the substrate processing assemblies 160. In one embodiment, the central transfer device 145 is a central robot having one or more blades configured to transport substrates between each substrate processing assembly 160. In another embodiment, the central transfer device is a carousel system by which processing regions are moved along a circular orbital path centered on the central axis 155 of the transfer chamber assembly 150.

FIG. 2 is a plan view of the cluster tool assembly 200 with multiple transfer chamber assemblies 150 connected thereto. The FOUPs 110, FI 120, and load lock chambers 130 may be arranged similarly to the FOUPs 110, FI 120, and load lock chambers 130 described above in relation to FIG. 1. The cluster tool assembly 200 of FIG. 2 further includes an FI etch apparatus 115, a buffer chamber 203, and a plurality of transfer chamber assemblies 150.

The FI etch apparatus 115 is positioned adjacent to the FI 120, such that the FI etch apparatus 115 is disposed on a side wall of the FI 120. The FI etch apparatus 115 may be positioned on a side wall of the FI 120 that is separate from the side walls of the FI that are connected to the FOUPs 110 and the load lock chambers 130. The FI etch apparatus 115 may be an etch chamber. The FI etch apparatus 115 may be similar to the Centris® line of etch chambers available from Applied Materials, Inc.

The buffer chamber 203 is located between the load lock chambers 130 and the plurality of transfer chamber assemblies 150 and provides an isolatable volume through which substrates may be transferred among and between the load lock chambers 130 and the multiple transfer chamber assemblies 150. The buffer chamber 203 is coupled to both the load lock chambers 130 and the plurality of transfer chamber assemblies 150. As shown in FIG. 2, three transfer chamber assemblies 150 are disposed around and attached to the buffer chamber 203. In other embodiments, there may be one, two, or more than three transfer chamber assemblies 150 disposed around the buffer chamber 203.

The buffer chamber 203 includes least one opening 209 along each wall of the buffer chamber 203 that is in contact with a transfer chamber assembly 150 or a load lock chamber 130. Each of the openings 209 is sized to allow the passage of a substrate, a substrate chuck, or a substrate on a substrate chuck to and from the transfer chamber assemblies 150. In some embodiments, there are two openings 209 along each wall of the buffer chamber 203 that is adjacent to the transfer chamber assemblies 150. This allows for the passage of two substrates to the transfer chamber assemblies 150 from the buffer chamber 203 or from the transfer chamber assemblies 150 to the buffer chamber 203 simultaneously.

The buffer chamber 203 includes one or more buffer chamber transfer robots 206. The buffer chamber transfer robots 206 move substrates, chucks, or both substrates and chucks between the transfer chamber assemblies 150 and the load lock chambers 130. The buffer chamber transfer robots 206 may be any suitable substrate transfer robot.

To enable isolation of the buffer chamber 203 internal volume from process gases used in the process assemblies 160 of the transfer chamber assemblies 150, access between each transfer chamber assembly 150, and the openings 209 in the buffer chamber 203 are selectively sealed by a respective fluid isolation valve, such as a slit valve. The fluid isolation valves (not shown) are disposed within the wall of each of the transfer chamber assemblies 150, the wall of the buffer chamber 203, or as a separate assembly between the buffer chamber 203 and the transfer chamber assembly 150. Additionally, the fluid isolation valves may include a plate and seal assembly which is pressed by a selectively operable ram to selectively cover and seal, or uncover, the respective opening 209. The plate and seal assembly thereby selectively seals, or allows, fluid communication between the transfer chamber assembly 150 and the buffer chamber 203 and also allows, when retracted away from an opening 209, a support blade or end effector on the buffer chamber transfer robot 206 in the buffer chamber 203 to transport a substrate through the opening 209.

The transfer chamber assemblies 150 may be configured the same as the one described above in relation to FIG. 1. This includes the placement and structure of the central transfer devices 145, the plurality of substrate processing assemblies 160, and the chamber pumps 165 within each of the transfer chamber assemblies 150. However, alternative embodiments of the transfer chamber assemblies 150 may be utilized.

Figure 3:
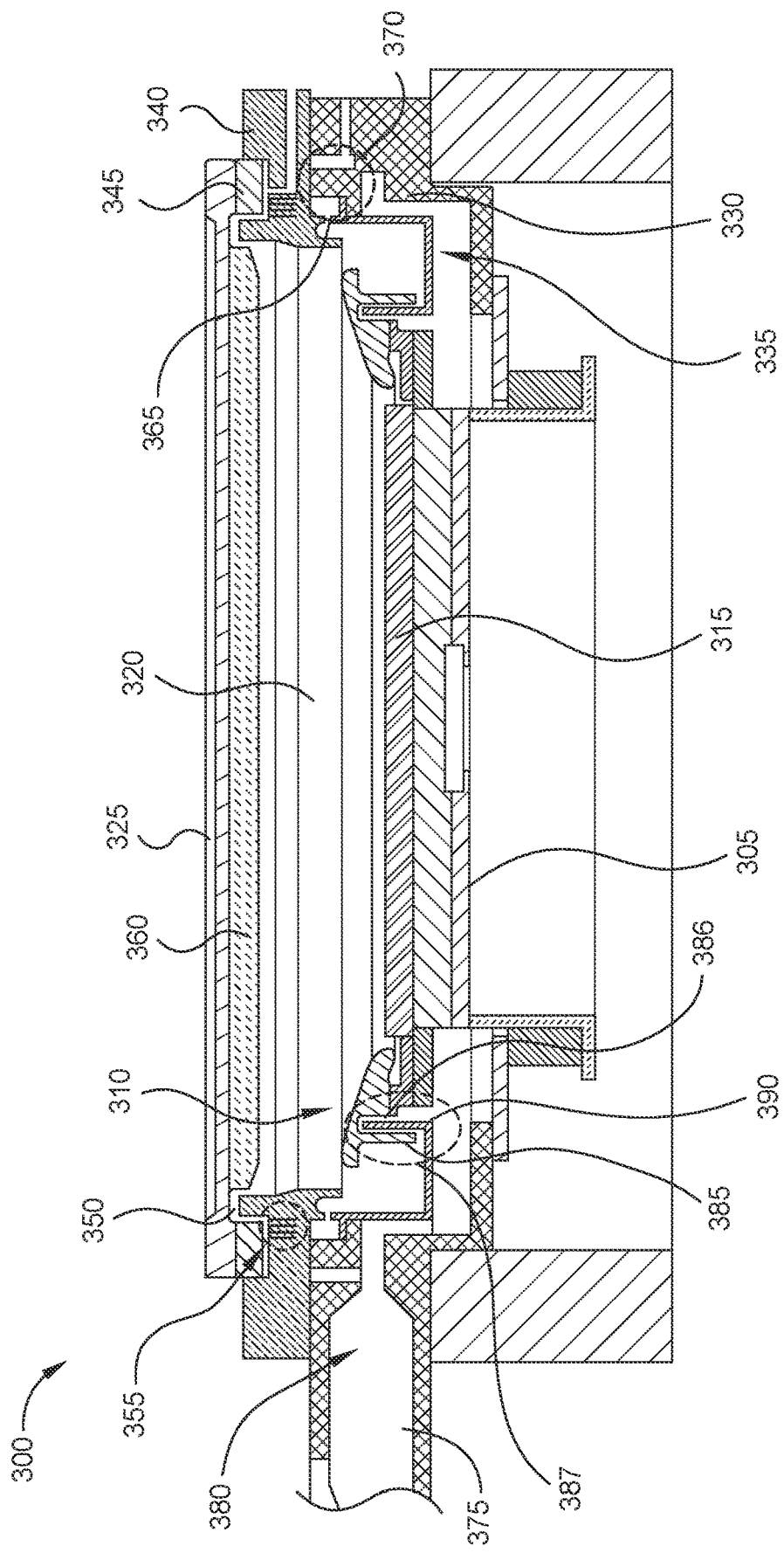
FIG. 3 depicts a substrate processing assembly according to certain embodiments.

FIG. 3 depicts a substrate processing assembly 300 according to certain embodiments. Substrate processing assembly 300, is one embodiment of substrate processing assembly 160 of FIGS. 1 and 2.

Substrate processing assembly 300 includes a substrate support 305. Although not shown substrate support 305 may include one or more lift pins, heaters, and in some embodiments may be coupled to a voltage bias source. Substrate support 305 in certain embodiments is surrounded by one or more cover rings, such as cover ring 310. A support surface 315 of the substrate support is positioned below a processing volume 320 of the substrate processing assembly 300.

Substrate processing assembly 300 further includes an electrode 325 positioned opposite the support surface 315. When a bias is applied to electrode 325, in embodiments where the electrode 325 includes a sputtering target, the material is produced for deposition upon a substrate positioned upon the support surface 315. In other embodiments, a bias applied to the electrode 325 may be used to strike a plasma in the processing volume 320.

Substrate processing assembly 300 further includes a process kit support 330, positioned about the processing volume 320, forming at least part of a total volume of the substrate processing assembly 300 that includes the processing volume 320. The process kit support 330 supports a lower shield assembly 335 positioned about a lower portion of the processing volume 320, including the substrate support 305 and the cover ring 310. The process kit support 330 further supports an upper shield assembly 340 positioned substantially about an upper portion of the processing volume 320, adjacent to the electrode 325. Between the electrode 325 and the upper shield assembly 340 is disposed a dielectric ring 345, to electrically insulate the upper shield assembly 340 from the electrode 325. Upper gas inlets 350 are formed between the upper shield assembly in fluid communication with a recursive gas path 355, which is in turn coupled to a first gas source (not shown). The recursive gas path 355 may be seen in greater detail in FIGS. 4 and 6. When gas is provided to the recursive gas path 355, such gas is provided to the processing volume 320 via the upper gas inlets 350, to a dark space gap 360 of the processing volume.

Between the lower shield assembly 335 and the upper shield assembly 340 are positioned a plurality of lower gas inlets 365 in fluid communication with the processing volume 320. Coupled to the lower gas inlets 365 and positioned within the processing ring is formed a dual reservoir assembly 370 coupled to a gas source (not shown), shown in greater detail in FIGS. 4 and 5.

The substrate processing assembly 300 further includes an exhaust port 375 in fluid communication with the processing volume 320. An exhaust gas path 380 flows along a circuitous path from the processing volume 320, under a cover ring extension 385, over an end shield portion 390 of the lower shield assembly 335, and beneath the lower shield assembly 335 before entering the exhaust port 375. By forming a baffle 387 by surrounding the end shield portion 390 with the cover ring extension 385 and an inner cover ring inner surface 386, the exhaust gas path 380 serves to remove skewness and from the gas composition over the substrate support 305 in the processing volume 320 during the processing of a substrate.

Figure 4:
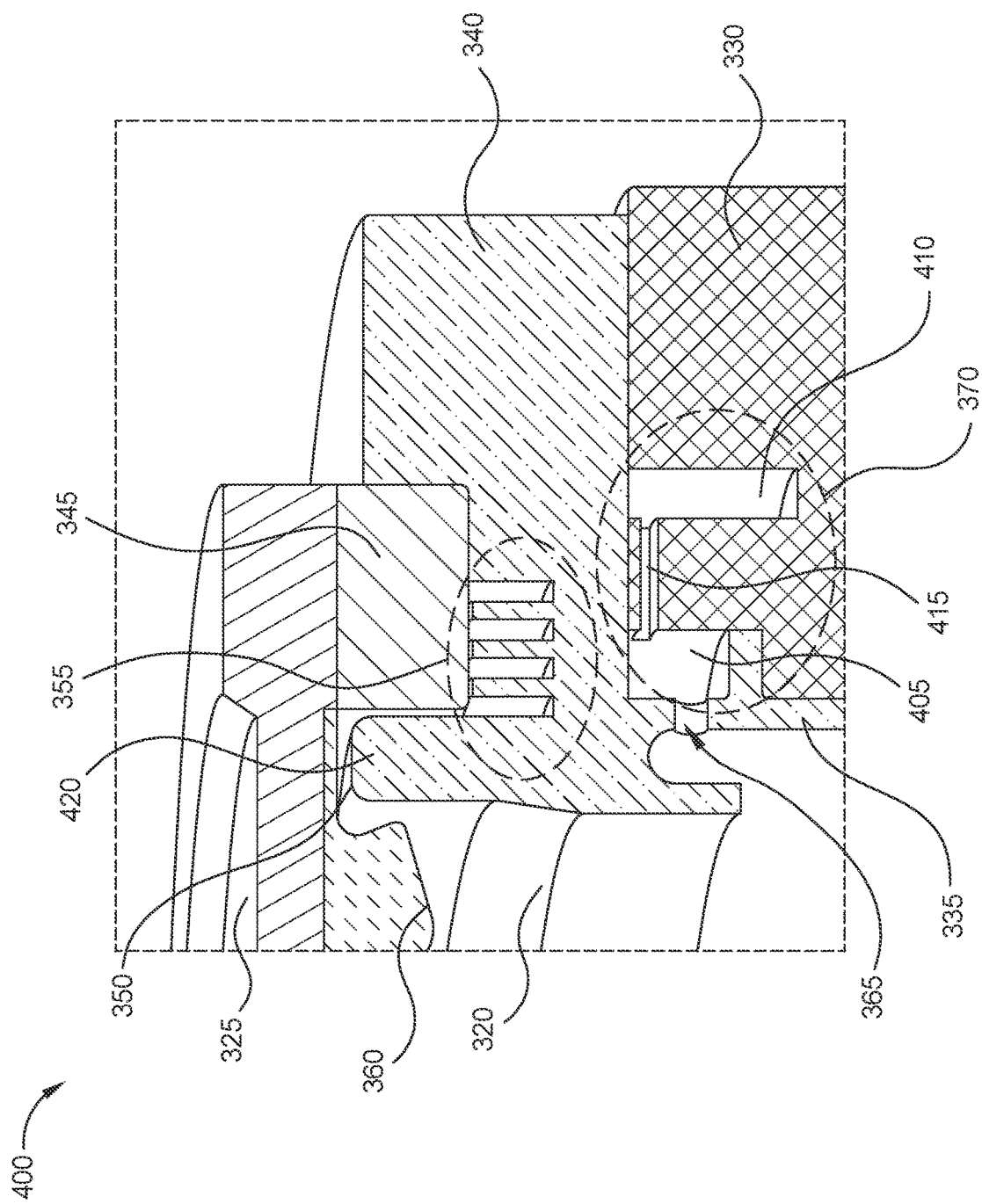
FIG. 4 depicts a perspective view of a dual reservoir assembly and a recursive path gas assembly, according to certain embodiments.

FIG. 4 is an enlarged perspective view 400 of the dual reservoir assembly 370 of FIG. 3 and a recursive gas path assembly 355, according to certain embodiments.

The dual reservoir assembly 370 includes the lower gas inlets 365 fluidly coupling a first annular groove 405 to the processing volume 320. The first annular groove is positioned circumferentially about the processing volume 320. In certain embodiments, a portion of the first annular groove 405 may be formed by the lower shield assembly 335 and by the process kit support 330, while in other embodiments, the first annular groove 405 is completely formed in the process kit support 330.

The dual reservoir assembly 370 further includes a second annular groove 410 positioned circumferentially about the first annular groove 405 and coupled thereto via one or more gas passages 415. The second annular groove 410 is further coupled to a gas source (not shown) that may be the same gas source or a different gas source than others mentioned herein. The gas source may provide one or more gases to the second annular groove 410. The dual reservoir assembly 370 is discussed in greater detail below in connection with FIG. 5.

The recursive gas path 355 is formed by the upper shield assembly 340 and the dielectric ring 345. Gas is provided from a gas source (not shown) that may include one or more gases. The gas source may be the same gas source providing gas to the dual reservoir assembly 370 or a separate gas source providing one or more different gases. The gas is provided to the processing volume 320 from the recursive gas path 355 along an upper shield extension 420, via the upper gas inlets 350, injecting the gas adjacent to the electrode 325, in a dark space gap of the processing volume 320. The recursive gas path 355 will be discussed in greater detail below in connection with FIG. 6.

Figure 5:
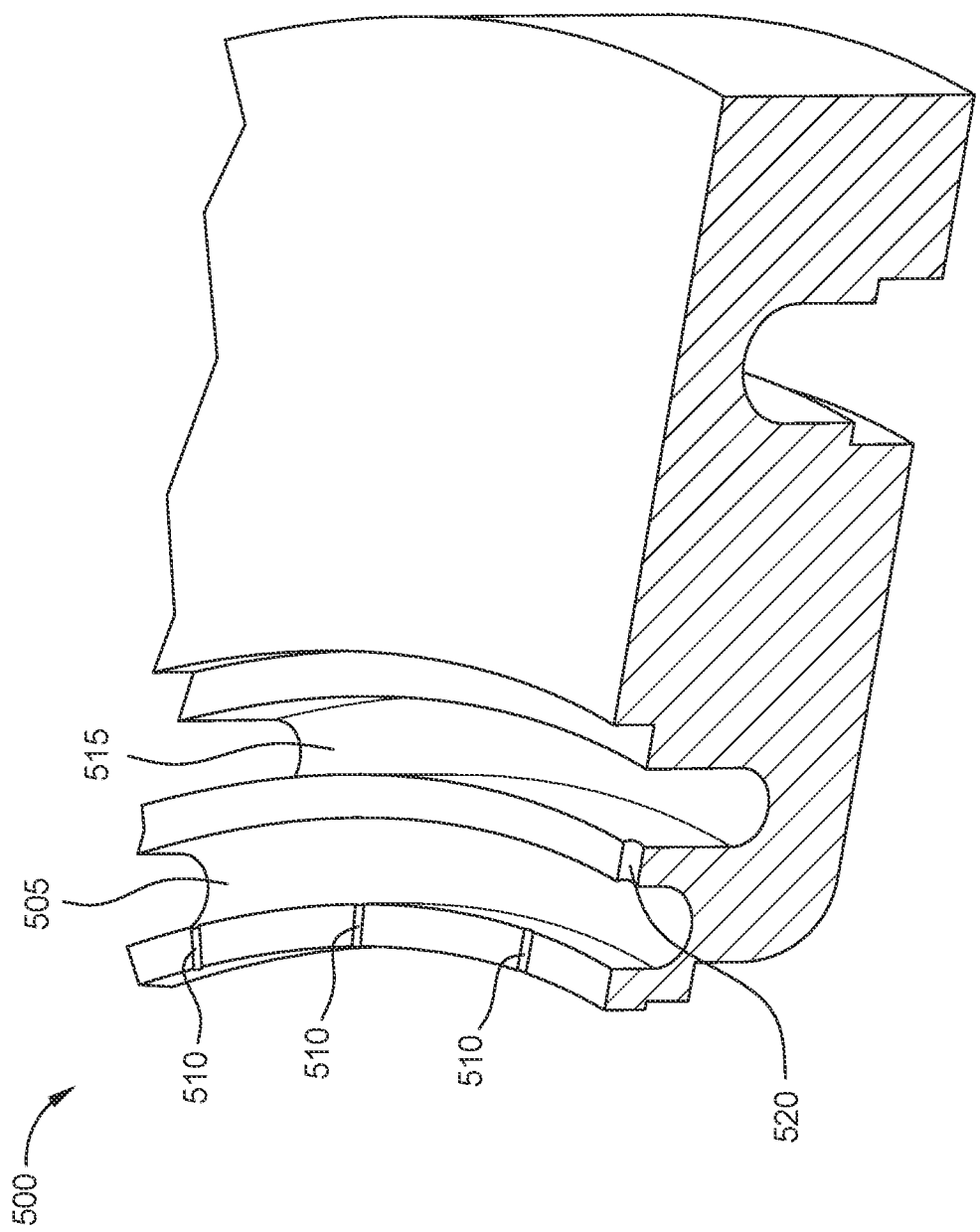
FIG. 5 depicts a dual gas reservoir assembly according to certain embodiments.

FIG. 5 depicts a dual gas reservoir assembly 500 according to certain embodiments. The depicted dual gas reservoir assembly 500 may be like the dual reservoir assembly 370 of FIGS. 3 and 4.

The dual gas reservoir assembly 500 includes a first annular groove 505 that may be like the first annular groove 405 of FIG. 4, positioned within a process kit support, to be circumferentially positioned about a processing volume when the process kit support is positioned within a substrate processing assembly. In certain embodiments, the first annular groove 505 has a width of about 0.60 inches, +/−up to 0.05 inches, and a depth of about 0.80 inches, +/−up to 0.05 inches. The processing volume may be like processing volume 320 of FIGS. 3 and 4, the process kit support may be like process kit support 330, and the substrate processing assembly may be like substrate processing assembly 300 of FIG. 3. The first annular groove 505 is coupled to one or more lower gas inlets 510, which may be like lower gas inlets 365 of FIG. 3 and which enable fluid communication between the first annular groove 505 and the processing volume.

The dual gas reservoir assembly 500 further includes a second annular groove 515, positioned within a process kit support circumferentially about the first annular groove 505. In certain embodiments, the second annular groove 515 has a width of about 0.30 inches, +/−up to 0.05 inches, and a depth of about 0.50 inches, +/−up to 0.05 inches. The second annular groove 515 is coupled to the first annular groove 505 via one or more gas passages 520, which may be like gas passage 415 of FIG. 4. The second annular groove 515 is coupled to one or more gas sources. In some embodiments, the one or more gas passages 520 are offset from the one or more lower gas inlets 510. In some embodiments, fewer gas passages 520 are provided than lower gas inlets 510.

Figure 6:
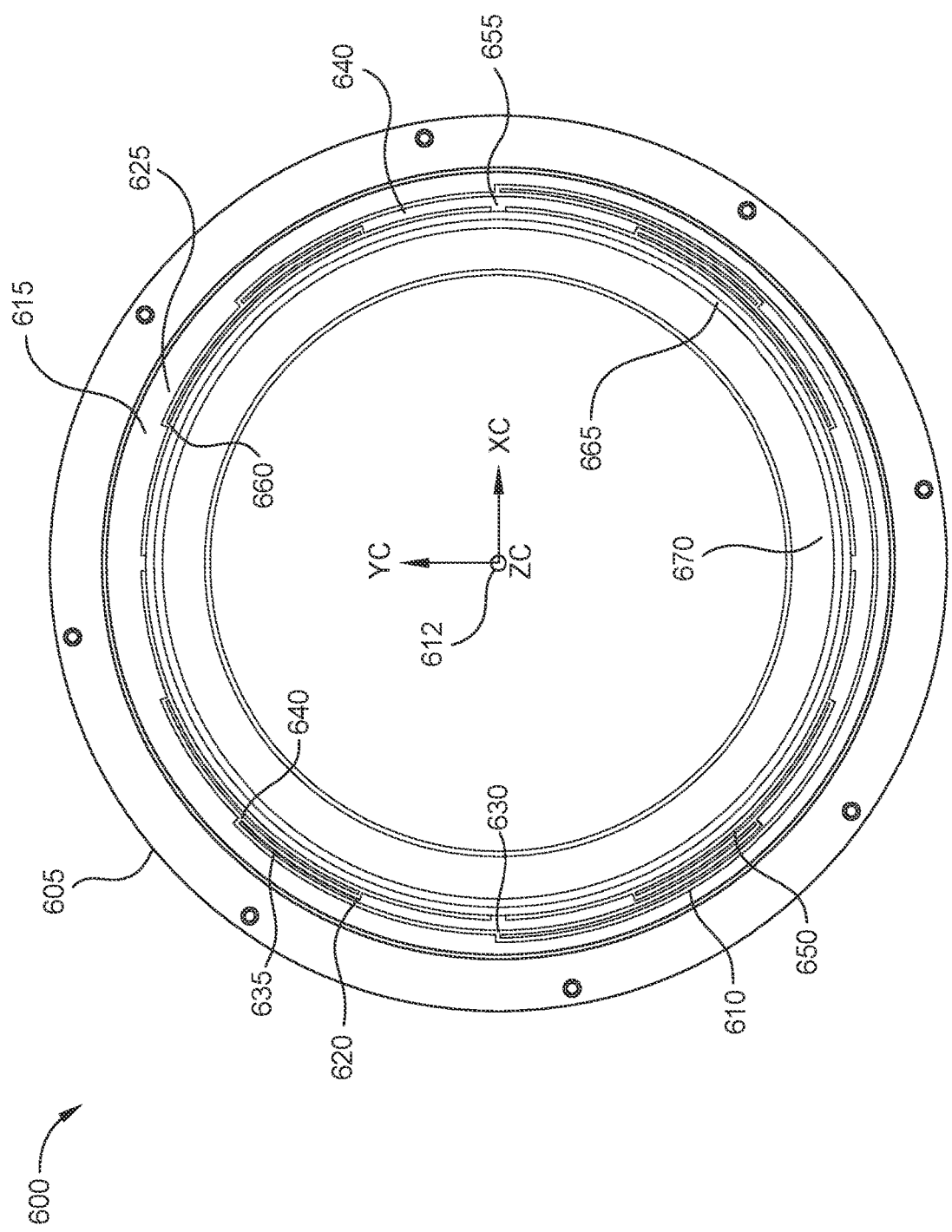
FIG. 6 depicts a recursive gas path in accordance with certain embodiments.

FIG. 6 depicts a recursive gas path 600 according to certain embodiments, in a top-down view of an upper shield assembly 605, such as upper shield assembly 340 of FIGS. 3 and 4.

Within the upper shield assembly 605, the recursive gas path 600 is positioned to provide one or more gases to a processing volume, such as processing volume 320 of FIGS. 3 and 4, and in certain embodiments to a dark space gap such as dark space gap 360 of FIGS. 3 and 4.

An outer arcuate gas passage 610 is positioned in the upper shield assembly 605 at a first circumference relative to a centerline 612 of the upper shield assembly 605, coupled to a gas source (not shown). The gas source may include one or more gas sources, providing one or a multiple of different gas types. The outer arcuate gas passage 610 is coupled to one or more first intermediate arcuate gas passages 620 at a second circumference 625 that is less than the first circumference 615 via one or more first gas passages 630.

The first intermediate arcuate gas passage 620 is connected to one or more second intermediate gas passages 635 positioned at a third circumference 640 via one or more second gas passages 645. In certain embodiments, the third circumference 640 is less than the second circumference 625.

The arcuate gas passages 610, 620, 635, and 650, as well as the first gas passage 630, second gas intermediate passage 640, and third gas passage 660 may be of different dimensions, generally about 0.120 inches wide, +/−up to 0.005 inches, and about 0.40 inches deep, +/−up to 0.05 inches.

The second intermediate gas passage 635 is connected to one or more inner arcuate gas passages 650 that is positioned at a fourth circumference 655 via one or more third gas passages 660. In certain embodiments, the second intermediate gas passage 635 may be connected to the same inner arcuate gas passage 650 in more than one location. In certain embodiments, the fourth circumference 655 is less than the third circumference 640. The inner arcuate gas passage 650 provides one or more gases along an upper shield extension 670, which may be like upper shield extension 420 of FIG. 4. When so provided, the provided gas crosses a gap created between a top surface 665 of the upper shield extension 670 and an electrode (not shown) that may be similar to electrode 325 of FIGS. 3 and 4.

Although arcuate recursive paths are shown at four different circumferences about the upper shield assembly 605, there may be fewer arcuate recursive paths or more placed at different circumferences.

Figure 7:
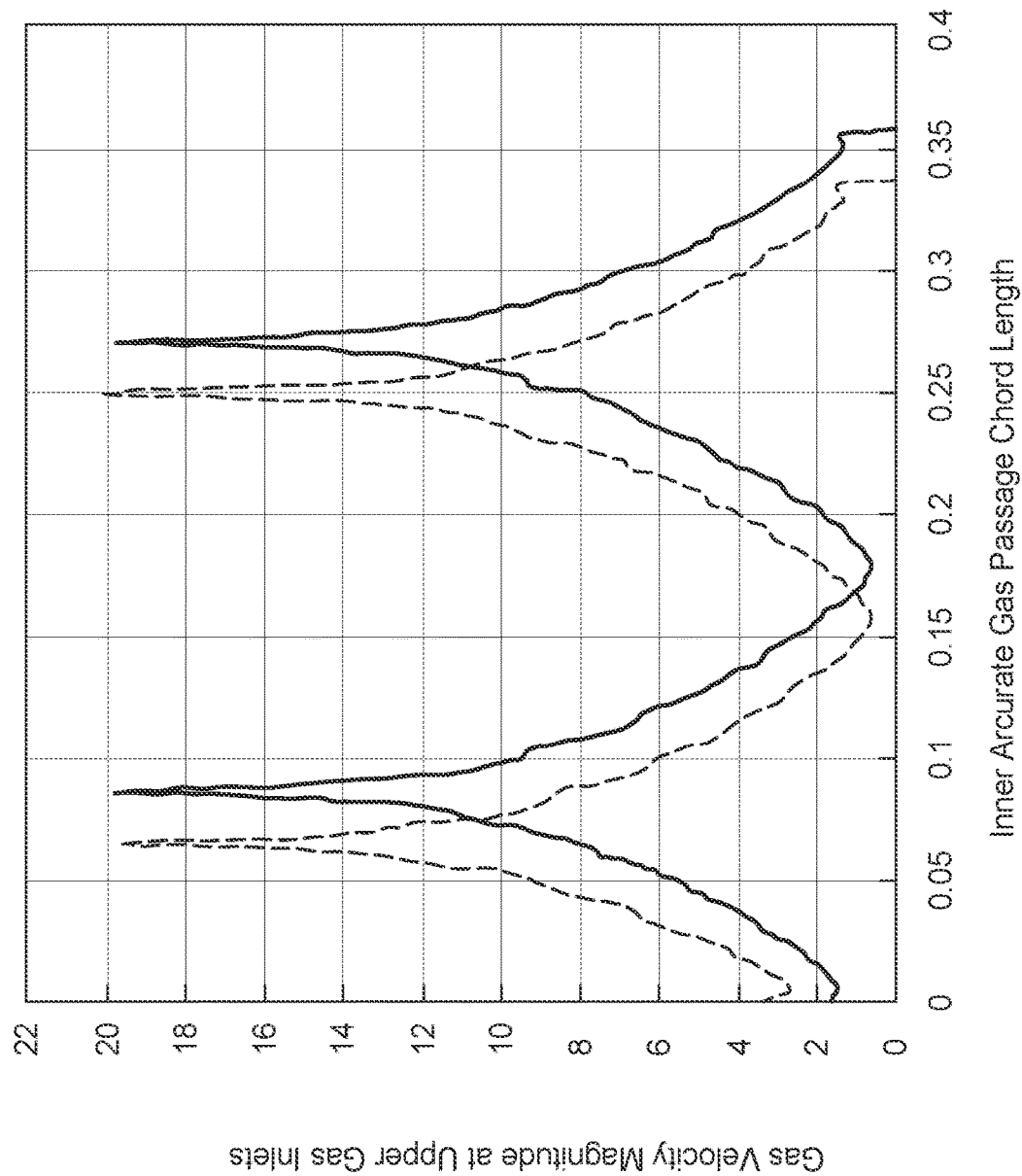
FIG. 7 depicts a chart depicting a relationship between gas velocity magnitude and arcuate gas path chord length, according to certain embodiments.

By providing a gas flow path following the circuitous path defined by the arcuate recursive gas paths, velocities of gas provided at each upper gas inlet, such as upper gas inlet 350 of FIG. 3, are equalized. Moreover, based on the chord length of the inner arcuate gas passage 650, velocities may be minimized, as depicted in FIG. 7.

By equalizing and minimizing the velocity of gas provided by each upper gas inlet, a jet effect of the gas over the surface of a substrate may be mitigated, preventing gas skewness and uneven sputter material concentration over the substrate.

While the foregoing is directed to embodiments of the present disclosure, other and further embodiments of the disclosure may be devised without departing from the basic scope thereof, and the scope thereof is determined by the claims that follow.

What is claimed is:

1. A substrate processing assembly, comprising:
   a dielectric ring;
   an upper shield assembly configured to surround a processing volume and a portion of an electrode, wherein
      the upper shield assembly comprises an upper shield extension and an outer arcuate gas passage at a first circumference relative to a centerline of the upper shield assembly,
      the dielectric ring is disposed between the upper shield assembly and the electrode, and
      the upper shield extension is disposed between a portion of the dielectric ring and the portion of the electrode; and
   an array of upper gas inlets disposed in the upper shield assembly, and positioned to provide one or more gases to a gap that is in fluid communication with the processing volume and is formed between the electrode and the upper shield extension.

2. The substrate processing assembly of claim 1, wherein the outer arcuate gas passage is coupled to one or more first intermediate gas passages at a second circumference different from the first circumference.

3. The substrate processing assembly of claim 2, wherein the second circumference is less than the first circumference.

4. The substrate processing assembly of claim 3, wherein the one or more first intermediate arcuate gas passages are connected to one or more second intermediate gas passages positioned at a third circumference through one or more second gas passages, the third circumference being less than the second circumference.

5. The substrate processing assembly of claim 2, wherein the second intermediate arcuate gas passages are connected to one or more inner arcuate gas passages positioned at a fourth circumference through one or more third gas passages.

6. The substrate processing assembly of claim 5, wherein the one or more inner arcuate gas passages are configured to provide one or more gases along the upper shield extension.

7. The substrate processing assembly of claim 6, wherein the upper shield assembly is configured to provide the one or more gases across the gap created between a top surface of the upper shield extension and an electrode.

8. The substrate processing assembly of claim 1, wherein the gap is a dark space gap between the top surface of the upper shield extension and the electrode.

9. A substrate processing assembly, comprising:
a dielectric ring;
an upper shield assembly configured to surround a processing volume and a portion of an electrode, wherein the upper shield assembly comprises an upper shield extension and a recursive gas path,
the dielectric ring is disposed between the upper shield assembly and the electrode, and
the upper shield extension is between a portion of the dielectric ring and the portion of the electrode; and
an array of upper gas inlets disposed in the upper shield assembly, and positioned to provide one or more gases to a gap formed between the electrode and the upper shield extension.

10. The substrate processing assembly of claim 9, wherein the recursive gas path comprises an outer arcuate gas passage at a first circumference relative to a centerline of the upper shield assembly positioned within the upper shield assembly.

11. The substrate processing assembly of claim 10, wherein the outer arcuate gas passage is coupled to one or more first intermediate arcuate gas passages at a second circumference through one or more first gas passages, the second circumference being less than the first circumference.

12. The substrate processing assembly of claim 11, wherein the one or more first intermediate arcuate gas passages are connected to one or more second intermediate gas passages positioned at a third circumference through one or more second gas passages, the third circumference being less than the second circumference.

13. The substrate processing assembly of claim 12, wherein the second intermediate arcuate gas passages are connected to one or more inner arcuate gas passages positioned at a fourth circumference through one or more third gas passages.

14. The substrate processing assembly of claim 13, wherein the one or more inner arcuate gas passages are configured to provide one or more gases along the upper shield extension.

15. The substrate processing assembly of claim 14, wherein the recursive gas path is configured to provide the one or more gases across a gap created between a top surface of the upper shield extension and an electrode.

16. A substrate processing assembly, comprising:
a dielectric ring;
an upper shield assembly comprising an upper shield extension and a recursive gas path;
a lower shield assembly surrounding the processing volume
a plurality of lower gas inlets disposed about the lower shield assembly, positioned to provide one or more gases to a lower annular portion of the processing volume adjacent to a cover ring, the lower gas inlets fluidly coupled to dual gas reservoirs; and
an array of upper gas inlets disposed in the upper shield assembly, positioned to provide one or more gases to a gap of the substrate processing assembly, the upper gas inlets fluidly coupled to the recursive gas path.

17. The substrate processing assembly of claim 16, wherein the dual gas reservoirs are positioned within a process kit support of the substrate processing assembly, and the recursive gas path is positioned within a shield assembly.

18. The substrate processing assembly of claim 17, wherein the dual gas reservoirs comprises:
a first gas reservoir comprising a first annular groove positioned within the process kit, in fluid communication with the lower gas inlets; and
a second gas reservoir comprising a second annular groove positioned about the first gas reservoir, in fluid communication with the first annular groove.

19. The substrate processing assembly of claim 17, wherein the recursive gas path comprises an outer arcuate gas passage at a first circumference relative to a centerline of the upper shield assembly connected to at least one or more intermediate arcuate gas passages at a second circumference.

20. The substrate processing assembly of claim 19, wherein the at least one or more intermediate arcuate gas passages are connected to one or more inner arcuate gas passages, the inner arcuate gas passages configured to provide a gas across said gap created between a top surface of the upper shield extension and an electrode.

* * * * *